(12) United States Patent
Krijne et al.

(10) Patent No.: US 8,808,402 B2
(45) Date of Patent: Aug. 19, 2014

(54) ARRANGEMENT FOR HOLDING A SUBSTRATE IN A MATERIAL DEPOSITION APPARATUS

(75) Inventors: Johannes Krijne, PH Best (NL); Erwin Eiling, BS Vaals (NL); Karl-Heinz Hohaus, Linnich (DE); Wolfgang Goergen, Alsdorf (DE); Andreas Lovich, Augsburg (DE); Marc Philippens, Regensburg (DE); Richard Scheicher, Thierhaupten (DE); Ansgar Fischer, Königsbrunn (DE); Martin Mueller, Untermeitingen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 159 days.

(21) Appl. No.: 13/262,776

(22) PCT Filed: Mar. 29, 2010

(86) PCT No.: PCT/IB2010/051356
§ 371 (c)(1),
(2), (4) Date: Apr. 2, 2012

(87) PCT Pub. No.: WO2010/113102
PCT Pub. Date: Oct. 7, 2010

(65) Prior Publication Data
US 2012/0178190 A1 Jul. 12, 2012

(30) Foreign Application Priority Data

Apr. 3, 2009 (EP) .................................... 09157249
Feb. 23, 2010 (EP) .................................... 10154410

(51) Int. Cl.
*H01L 51/40* (2006.01)

(52) U.S. Cl.
USPC ............. 29/25.01; 438/34; 438/99; 438/780; 438/944

(58) Field of Classification Search
USPC .................... 29/25.01; 438/34, 99, 780, 944, 438/FOR. 135; 257/E21.091
See application file for complete search history.

(56) References Cited

U.S. PATENT DOCUMENTS 3,801,390 A * 4/1974 Lepselter et al. .................. 216/2
4,615,781 A * 10/1986 Boudreau .................... 427/96.8
(Continued)

FOREIGN PATENT DOCUMENTS

JP 2003-217850 7/2003
JP 2005-232474 9/2005
(Continued)

*Primary Examiner* — George Fourson, III
(74) *Attorney, Agent, or Firm* — Cozen O'Connor (57) ABSTRACT

An arrangement (1) for holding a substrate (10) in a material deposition apparatus, which substrate (10) has a deposition side (10a) upon which material (M) is to be deposited, and which arrangement (1) comprises: a shadow mask (20) comprising a number of deposition openings (Di); a support structure (30) comprising a number of surround openings (Si); and a support structure holding means (6) for holding the support mask (30) and/or a substrate holding means (5) for holding the substrate (10), such that the support structure (30) is on the same side as the deposition side (10a) of the substrate (10), and the shadow mask (20) is positioned between the substrate (10) and the support structure (30) such that at least one deposition opening (Di) of the shadow mask (10) lies within a corresponding surround opening (Si) of the support structure (30).

15 Claims, 5 Drawing Sheets

(56) References Cited

U.S. PATENT DOCUMENTS

| | | | |
|---|---|---|---|
| 7,622,899 B2* | 11/2009 | Yi et al. | 438/99 |
| 2002/0135287 A1* | 9/2002 | Fukuzawa et al. | 313/402 |
| 2003/0218419 A1* | 11/2003 | Bae | 313/504 |
| 2006/0148114 A1* | 7/2006 | Yotsuya et al. | 438/29 |
| 2007/0190888 A1* | 8/2007 | Griffin et al. | 445/30 |
| 2008/0118743 A1* | 5/2008 | Lee et al. | 428/332 |
| 2008/0150414 A1* | 6/2008 | Sung et al. | 313/498 |
| 2010/0212596 A1* | 8/2010 | Eida et al. | 118/729 |
| 2012/0329188 A1* | 12/2012 | Sonoda et al. | 438/34 |

FOREIGN PATENT DOCUMENTS

| | | |
|---|---|---|
| JP | 2006-188731 | 7/2006 |
| JP | 2006-216289 | 8/2006 |
| JP | 2006-244746 | 9/2006 |
| JP | 2008-240088 | 10/2008 |

\* cited by examiner

ARRANGEMENT FOR HOLDING A SUBSTRATE IN A MATERIAL DEPOSITION APPARATUS

RELATED APPLICATIONS

This is a U.S. national stage of application No. PCT/IB2010/051356, filed on Mar. 29, 2010.

This application claims the priority of European application no. 09157249.5 filed Apr. 3, 2009 and 10154410.4 filed Feb. 23, 2010, the entire contents of both of which are hereby incorporated by reference.

FIELD OF THE INVENTION

The invention describes an arrangement and method of arranging a substrate and a shadow mask in a material deposition apparatus.

BACKGROUND OF THE INVENTION

In some semiconductor manufacturing processes, a vapour deposition step is necessary in order to deposit matter—organic or inorganic—on a substrate. In some processes, the matter must be deposited within precisely defined areas on the substrate. To simplify the deposition process, a shadow mask is usually applied to one side of the substrate, and cut-outs or openings in the shadow mask define the regions in which matter will be deposited. It is usually a requirement that the material be precisely deposited in the regions corresponding to the openings, so that the boundaries or edges of these regions are sharp. For example, organic material must be deposited in exactly defined regions during the manufacture of organic light-emitting diodes (OLEDs) intended for use in displays or other lighting applications.

However, problems arise when the shadow mask does not maintain a satisfactory close contact with the substrate during the deposition process. Since the substrate and the shadow mask are thin, and have a large area in proportion to their thickness, they tend to sag under their own weight when held in a horizontal position. Material deposition usually takes places in a chamber, usually a vacuum chamber, in which the material to be vapourized is contained in evaporation sources known as 'boats' or 'crucibles' with or without a connected 'showerhead', as will be known to the skilled person. These are heated in some suitable manner, for example electrically, so that the material vaporizes. During this vaporization, high temperatures can be reached in the chamber. As a result, the material of the shadow mask can thermally expand and ultimately part from the substrate. Also, material being deposited does not only arrive at the substrate, but some amount will also arrive at the shadow mask and adhere to it. If the material is being deposited in a vapour deposition process, so that the shadow mask is on the underside of the substrate, superfluous material adhering to the shadow mask in the areas between the openings can be an additional contribution to the shadow mask sag.

When the shadow mask no longer adheres to the substrate over its entire area, the boundaries of the material deposited in the openings are no longer precisely defined, and a poor product quality may be the result. Uneven or smudged edges of deposited regions are unacceptable in a product such as an OLED display, and such poor quality can result in high costs.

A number of approaches have been taken in an effort to reduce the amount of sagging in the shadow mask. For example, the shadow mask can subject to an outward pulling force by means of clamps attached to the substrate or to a frame. In other prior art solutions to the problems associated with material deposition under the adverse conditions mentioned, a metal shadow mask is pre-tensioned prior to being welded onto a mask-retaining metal frame before the vapour deposition commences. However, since material deposits accumulate on the shadow mask, this must eventually be replaced. A shadow mask that is simply attached to the frame by means of clamps can relatively easily be removed and replaced, but a welded shadow mask requires an additional effort in its removal by mechanical means, and the frame surface may also need to be milled before the next shadow mask is welded into place. Therefore, such an approach is relatively expensive. Furthermore, since most OLEDs require multiple layers to be built up in consecutive deposition steps, use of a welded mask may be particularly inconvenient. Other prior art efforts often involve restraining the shadow mask using a spring-loaded holding means to 'pull' the shadow mask in an outward direction. The application of a tensile force to the shadow mask aims to prevent 'folds' or 'ripples' from appearing in the shadow mask when this is subject to thermal expansion during the vapour deposition process. However, a shadow mask used in the manufacture of OLEDs for lighting purposes generally has a high proportion of openings in its overall surface area, also termed 'negative area', so that the application of a lateral tensile force is of limited advantage. Also, with this approach, it is difficult to ensure that the shadow mask and substrate remain in position relative to one another. It may happen that the shadow mask shifts or moves to one side during transport or deposition, resulting in unacceptable "smudged" material layers. For this reason, in practice, arrangements are used in which the substrate and the shadow mask are held in a vertical position during the material deposition process. However, for products such as displays, in which material is deposited to form OLED pixel regions, any foreign particles that adhere to the substrate—usually by falling onto the substrate—may result in a visible defect. For this reason, in the manufacture of such products, it would be preferable for the substrate to be held such that the material is deposited from below.

SUMMARY OF THE INVENTION

Therefore, it is an object of the invention to provide a straightforward and reliable way of ensuring precise material deposition on a substrate in a material deposition process.

One aspect of the invention is directed to an arrangement for holding a substrate, which substrate has a deposition side or face upon which material is to be deposited in a material deposition apparatus. The arrangement comprises a shadow mask comprising a number of deposition openings, a support structure comprising a number of surround openings, and a support structure holding means for holding the support structure and/or a substrate holding means for holding the substrate. The arrangement is such that, during a material deposition process, the support structure is on the same side as the deposition side of the substrate and the shadow mask is positioned between the substrate and the support structure such that at least one deposition opening of the shadow mask lies within a corresponding surround opening of the support mask. Because the shadow mask can be held in place against the substrate effectively without any sagging on the part of the shadow mask, the arrangement is particularly suitable for use in any type of deposition procedure in which the material is of necessity deposited from below—such as in the manufacture of OLED displays—and in which particular care must be taken to avoid any contamination of the deposition surface, as mentioned in the introduction.

An advantage is that the shadow mask is supported essentially over its entire area during the material deposition process. Therefore, even though the shadow mask has a very delicate structure, with a high proportion of openings or negative area, it is effectively supported by the support structure and prevented from parting from the substrate during the vapour deposition process. The support structure effectively acts to hold the shadow mask flat, so that the substrate is in contact with the shadow mask over its entire surface. An additional advantage of the arrangement is that, with appropriate choice of material for the support structure, this can act as a thermal shield to 'absorb' heat, thus reducing the degree to which the shadow mask is heated. Finally, because the weight of the shadow mask can be borne by the support structure, the shadow mask itself can be made of a very thin material e.g. a thin sheet, 0.05 mm to 0.3 mm in thickness. Using this arrangement, therefore, material can be deposited on the substrate within very precisely defined regions.

This arrangement therefore allows the production of high-quality semiconductor devices in an economical and straightforward manner.

A corresponding method of arranging a substrate (with a deposition side upon which material is to be deposited), a shadow mask (with a number of deposition openings) and a support structure (with a number of surround openings) in a material deposition apparatus comprises positioning the shadow mask and the support structure relative to the substrate such that the support mask is on the same side as the deposition side of the substrate, and the shadow mask is positioned between the substrate and the support structure such that at least one deposition opening of the shadow mask lies within a corresponding surround opening of the support structure.

The arrangement according to an embodiment of the invention can be applied in any appropriate material deposition process such as those applied in state-of-the-art semiconductor manufacturing sites. However, the arrangement is particularly suited to a vapour deposition process, for example a vacuum deposition process, in which the material—for example an organic material—is heated and deposited on the deposition face, preferably the underside, of a substrate held in a horizontal position. In the following, therefore, where reference is made to "material deposition", this may be understood to also include a vapour deposition. Use of the term "vapour deposition" will not exclude deposition of a material in a form other than vapour, unless explicitly stated.

The support structure can be designed in any shape suitable to support the shadow mask. In particular, the support structure can comprise a support mask or support bars. The support bars can be shaped in the form of a frame surrounding the perimeter of the shadow mask. The support bars can additional comprise bars extending from the outer periphery of the support structure in the direction of the centre of the support structure in order to provide additional support to the central parts of the shadow mask. The support bars can also comprise crossing bars in order to enhance the stability and stiffness of the support structure and in order to provide more support to the shadow mask. Furthermore the number of openings in the support structure does not have to correspond to the number of openings in the shadow mask. For example the number of openings in the support structure can be lower than the number of openings in the shadow mask. In this case, one big opening in the support structure can correspond to at least two smaller openings in the shadow mask. The shape of the openings of the support structure can be different to the shape of the openings in the shadow mask. For example a smaller square shaped opening in the shadow mask can correspond to a bigger round-shaped opening in the support structure.

The support structure and the shadow mask can be formed as one-piece or can be separate pieces. In the case that the support structure and the shadow mask are formed as separate pieces clamps can be present in order to fix the support structure exchangeably to the shadow mask.

In the following description, certain advantageous embodiments of the invention will be explained, wherein the support structure is mainly shaped as a support mask. It is also possible to implement these embodiments by using a support structure shaped as support bars.

As already mentioned above, material is deposited on the substrate through a number of openings in the shadow mask. In an arrangement according to an embodiment of the invention, the shadow mask is "sandwiched" between the support mask and the substrate. Therefore, in a preferred embodiment of the invention, in order to allow material to be deposited in the intended regions given by the openings in the shadow mask, each deposition opening of the shadow mask is associated with a corresponding surround opening of the support mask. In the following, it is assumed that the shadow mask and support mask comprise a plurality of openings, but evidently the arrangement and method according to the invention could equally well be applied to a shadow mask and support mask each having only a single opening.

It has been pointed out above that the material deposited on the substrate should ideally have a homogenous layer thickness and precisely defined edges, particularly when the end-product is intended for use in applications such as displays, where the sharpness of a rendered image may be influenced to a great extent by the quality of the material deposition. The sharpness of the edges of the regions of material deposited on the substrate is governed to a large extent by the depth of the mask through which the material must pass before arriving at the substrate. The thinner the mask, the sharper will be the edges of the deposited regions. Therefore, in a further preferred embodiment of the invention, a surround opening of the support mask is larger than the associated deposition opening of the shadow mask. In this way, the support mask does not add to the thickness of the shadow mask at the edges of the deposition openings, while still being able to bear the weight of the shadow mask. In a further embodiment of the invention, the support mask may have bevelled or slanted edges, preferably with chamfered corners, so that the support mask does not in any way hinder the vapour from arriving at the deposition openings.

To ensure optimal support of the shadow mask while at the same time ensuring exact deposition of the material in the shadow mask openings, the shadow mask is preferably positioned relative to the support mask such that a deposition opening of the shadow mask is positioned over a corresponding surround opening of the support mask, and such that the deposition opening of the shadow mask lies within the corresponding, larger, surround opening of the support mask. For example, the openings of a support mask for a vapour deposition step in an OLED manufacturing process may be larger all round by up to a few millimeters than the openings in the shadow mask. This arrangement ensures that the support mask does not in any way adversely affect the precision of the material deposition process.

Since the shadow mask does not have to be in any way rigid, owing to the support function of the support mask in the arrangement according to the invention, the shadow mask can be made form a wide choice of material. For example, the shadow mask can be made of plastic, gel, a thin metal foil, etc. Because of the high temperatures that can be attained during material deposition, the shadow mask is preferably made of a material that exhibits little or no thermal expansion or deformation, for example a material such as stainless steel or Invar™, which has an exceptionally low coefficient of thermal expansion. To allow the material to be deposited in regions with sharply-defined edges, the shadow mask preferably has a thickness of at most 0.3 mm, and may be considerably thinner, for example a sheet of only 0.05 mm in thickness, as already mentioned.

In a particularly simple realisation of a support mask for use in an arrangement according to an embodiment of the invention, the support mask comprises one or more supporting elements such as a grid or a configuration of bars or rods positioned to give a number of surround openings and arranged such that they act to hold the shadow mask against the substrate while not impeding the material deposition through the deposition openings in the shadow mask. In a more elaborate realisation, the support mask can preferably comprise a relatively thin sheet of material with openings that essentially correspond to the openings of the shadow mask.

The choice of material for the support mask is essentially governed by its function. In order to satisfactorily ensure that the shadow mask is held closely to the substrate, the support mask should, to a large extent, be as rigid as possible. However, so as not to inhibit the material deposition process in any way, the support mask is preferably thin. Furthermore, the support mask should also be of a material that does not exhibit unfavourable thermal expansion at the temperatures achieved in a material deposition process. Again, Invar™ is a preferred choice of material owing to its favourable rigidity and low coefficient of thermal expansion, particularly in material deposition processes which do not permit use of a magnetic shadow or support mask. To provide a satisfactory support while at the same time not inhibiting the material deposition process in any way, the support mask preferably has a thickness of at least 2 mm. Depending on the application, the support mask can also be somewhat thicker, for example up to 10 mm. Obviously, the support mask and the shadow mask are preferably realized to have an even thickness throughout.

The supporting function of the support mask need not be limited to the rigidity of the material. In another preferred embodiment of the invention for use in deposition processes allowing the use of a magnetic mask, the support mask is made at least partially of a magnetic material, and the arrangement comprises one or more magnets positioned on the non-deposition side of the substrate to exert a magnetic force on the magnetic support mask. For example, in a vapour deposition process, the shadow mask in the arrangement according to the invention can preferably be held against the deposition side of the substrate from below, so that the vapour can rise upwards and be deposited in the openings of the shadow mask. An electromagnet situated above the substrate and activated during the vapour deposition process then acts to 'pull' the support mask upwards, thus ensuring that the shadow mask is effectively pressed against the substrate from below. The support mask can comprise magnetic regions incorporated into the material of the support mask, or it can comprise magnetic material throughout.

The openings or cut-outs of the shadow mask and support mask can be made in a number of ways. For example, the openings may be punched or stamped out in a die-cut process. However, such a die-cut process may not be exact enough to ensure that the edges, particularly the edges of the shadow mask, are precisely defined. Therefore, in a preferred embodiment of the invention, the openings of the shadow mask and/or a support mask can be made using a laser beam in a laser-cutting process. Another alternative might be to etch the openings in the masks using a suitable photochemical process.

An arrangement according to an embodiment of the invention comprises a frame for holding or transporting the substrate and support mask throughout the deposition process. The substrate, shadow mask, and support mask may be arranged in the frame in a number of ways. For example, the substrate can be placed in a substrate holding means of the frame, and a support mask/shadow mask ensemble can then be inserted into a support mask holding means. The substrate holding means and the support mask holding means may be separate holding means, or may be a single holding means. The support mask holding means may simply bear the weight of the support mask or it may be realised to actively press the ensemble against the substrate, for instance using a spring-loaded mechanism. The shadow mask can have been applied to the support mask by, for example, simply pressing the shadow mask onto the support mask. Alternatively, the support mask could be pressed onto the shadow mask from above. In either case, friction between the shadow mask and the support mask may be sufficient to ensure that the shadow mask 'sticks' to the support mask while inserting this ensemble into the frame.

In yet another approach, the support mask and shadow mask can be placed into the frame and held by a holding means, and the glass substrate can simply be placed onto the support/shadow mask ensemble from above, so that the weight of the substrate is also distributed over the support mask and borne by the support mask holding means. As already mentioned above, in a method performing material deposition according to the an embodiment of the invention, the shadow mask is preferably positioned underneath the deposition face of the substrate in a vapour deposition process, and the support mask is positioned below the shadow mask.

The arrangement and method according to embodiments of the invention can be put to use in any material deposition procedure, in deposition of vapour or solid material, in a horizontal or vertical holding position, etc. However, owing to the advantages described above, the apparatus and method according to embodiments of the invention are particularly suited for use in a vapour deposition procedure in which the substrate is held horizontally, the shadow mask is positioned below the substrate (with support mask below the shadow mask), and material is deposited from below. The arrangement and method according to embodiments of the invention are particularly suited for use in an OLED manufacturing process in which one or more precise layers of material must be deposited on a substrate, for example in a vapour deposition step.

Other objects and features of the present invention will become apparent from the following detailed descriptions considered in conjunction with the accompanying drawings. It is to be understood, however, that the drawings are designed solely for the purposes of illustration and not as a definition of the limits of the invention.

In the drawings, like numbers refer to like objects throughout. Objects in the diagrams are not necessarily drawn to scale. In particular, the relative dimensions of the substrate, shadow mask and support mask are not drawn to scale, since a substrate can have a thickness of up to several millimeters and the support mask can be a few millimeters thick, whereas a shadow mask can have a thickness in the order of only a few hundredths or tenths of a millimeter. Therefore, in the diagram, the thickness of the shadow mask and support mask are of necessity rather exaggerated.

DETAILED DESCRIPTION OF THE EMBODIMENTS

Figure 1A:
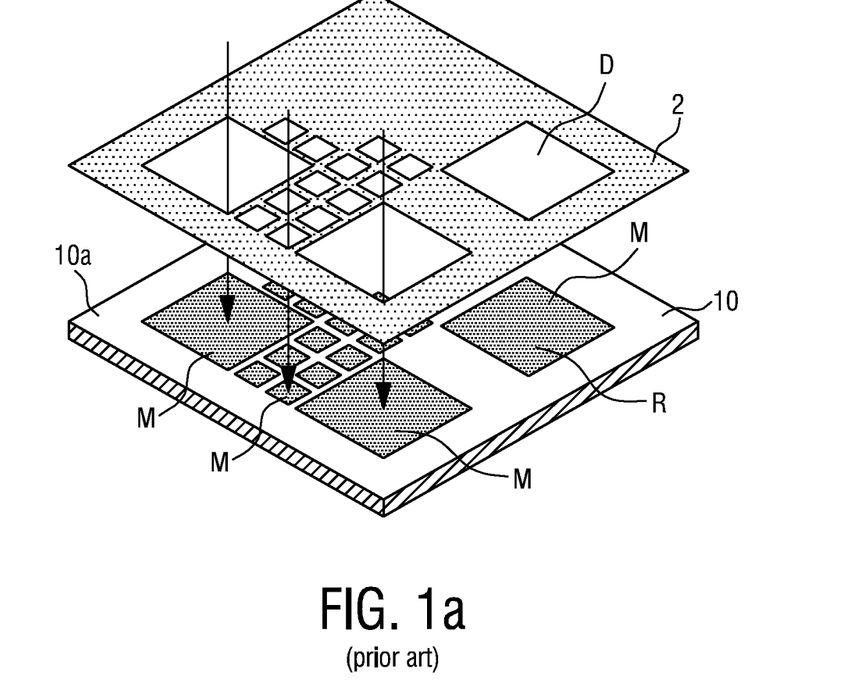
FIG. 1a shows the relationship between a substrate and a shadow mask for a material deposition process.

FIG. 1a shows the relationship between a substrate 10, upon which material is to be deposited, and a shadow mask 2. The material is to be deposited on a deposition side 10a of the substrate 10. The shadow mask 10 has a number of cut-outs or openings, and each opening is associated with a corresponding region on the deposition side 10a of the substrate 10. For example, deposition opening D of the shadow mask 2 is associated with the corresponding region R on the substrate 10. For the sake of clarity, only a few openings are shown. Evidently, the openings can be distributed over the entire area of the shadow mask, and they can be of any required shape.

Figure 1B:
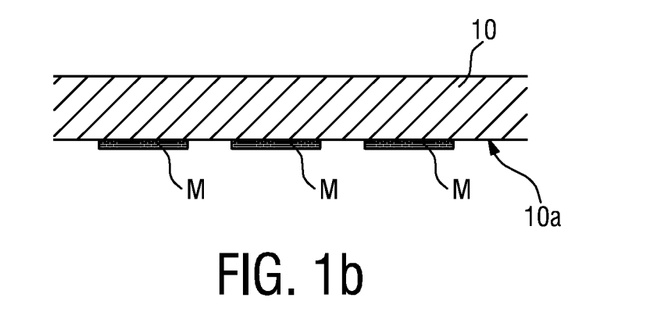
FIG. 1b shows a cross-section of a substrate with material deposits.

In OLED manufacture, as mentioned already, material is often deposited from below in a vapour deposition procedure. FIG. 1b shows a cross-section of a substrate 10 with a deposition side 10a upon which material M has been deposited from below. Usually, the thickness of the material layer is only in the region of nanometers, between 0.5 nm and 300 nm, and is shown greatly exaggerated in the diagram.

Figure 2:
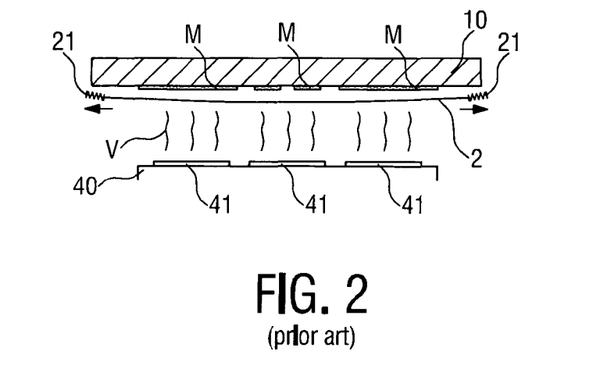
FIG. 2 shows a prior art assembly of a substrate and a shadow mask.

In a vapour deposition process, it must be ensured that the shadow mask is held against the deposition face of the substrate, even though the shadow mask is underneath the substrate. FIG. 2 shows a cross-section of a prior art arrangement of a substrate 10 and a shadow mask 2, in which spring-loaded hooks 21 are used to hold the shadow mask 2 and to exert an outward pull on the mask 2. For the shadow mask 2 to keep its shape, it must be of a minimum thickness and possess a certain degree of rigidity; otherwise the outward pull exerted on the mask 2 would deform it. In a vapour deposition oven, a material such as an organic material, held in one or more containers 41, is heated by a heating unit 40. Material vapour V rises upwards and passes through the openings (not shown in this cross-section) of the shadow mask 2 to be deposited as material deposits M on the deposition side 10a of the substrate 10. However, as already explained in the above, the weight of the shadow mask 2 itself, the effects due to thermal expansion, and the added weight of material M' deposited on the shadow mask 2 between the openings, all contribute to an eventual sagging of the mask 2, as indicated in an exaggerated manner in the diagram. Even if the gap between substrate 10 and shadow mask 2 is only a few microns deep, this leads to poor quality deposition of material, since the edges of the regions of deposited material M will not be as sharp or clearly defined as required.

Figure 3A:
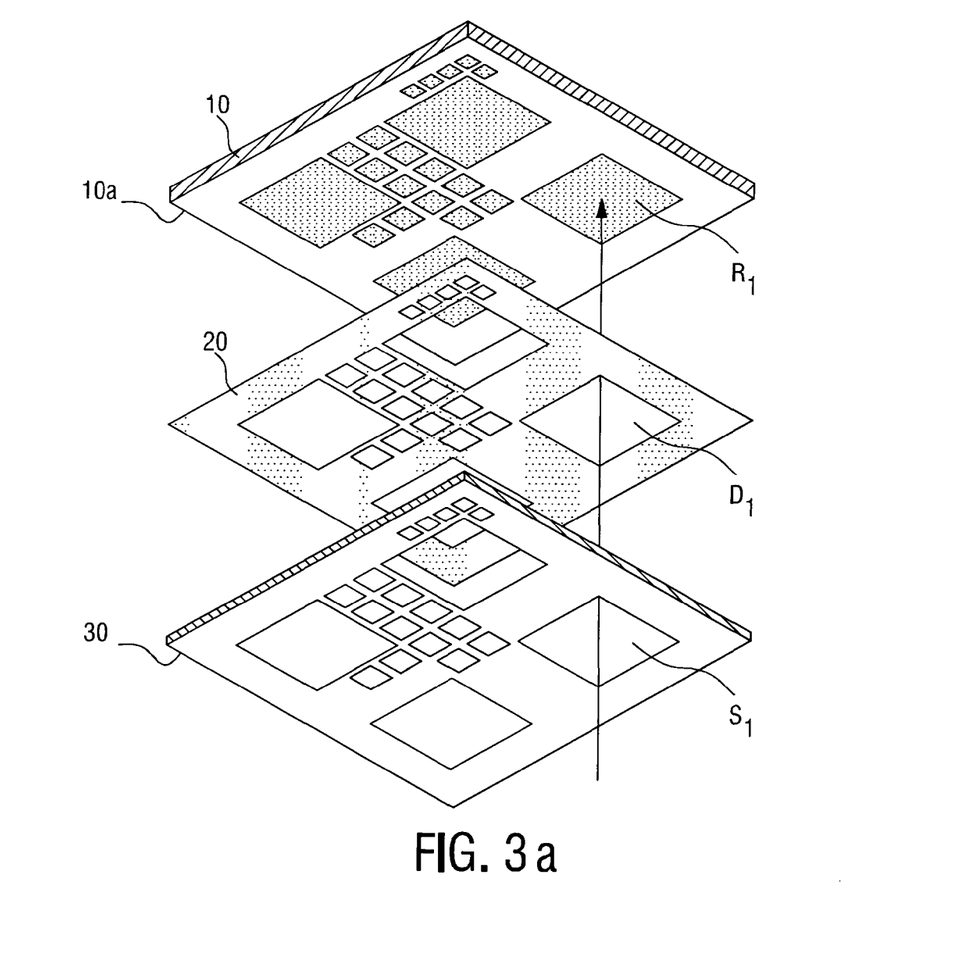
FIG. 3a shows a substrate, a shadow mask and a support mask in an arrangement according to the invention.

FIG. 3a shows an arrangement of a substrate 10, a shadow mask 20, and a support mask 30 according to the invention. The shadow mask 20 can be a thin sheet of plastic, gel, Invar™ etc, but does not inherently have to be rigid. The shadow mask 20 is 'sandwiched' between the substrate 10 and a support mask 30. Deposition openings of the shadow mask correspond to regions on the deposition side 10a of the substrate 10, in which material is to be deposited. Surround openings of the support mask 30 correspond to the deposition openings. In the diagram, for the sake of clarity, only the spatial relationship between one region Ri, one deposition opening Di, and one surround opening Si is shown. Evidently, this spatial relationship applies to all corresponding openings. The dimensions of the surround openings in the support mask 30 are such to be somewhat greater on all sides than the corresponding deposition openings, so that an opening in the support mask 30 effectively 'surrounds' the correspond opening in the shadow mask 20. Material can pass through a pair of openings Si, Di and be deposited in the corresponding region Ri on the substrate 10.

Figure 3B:
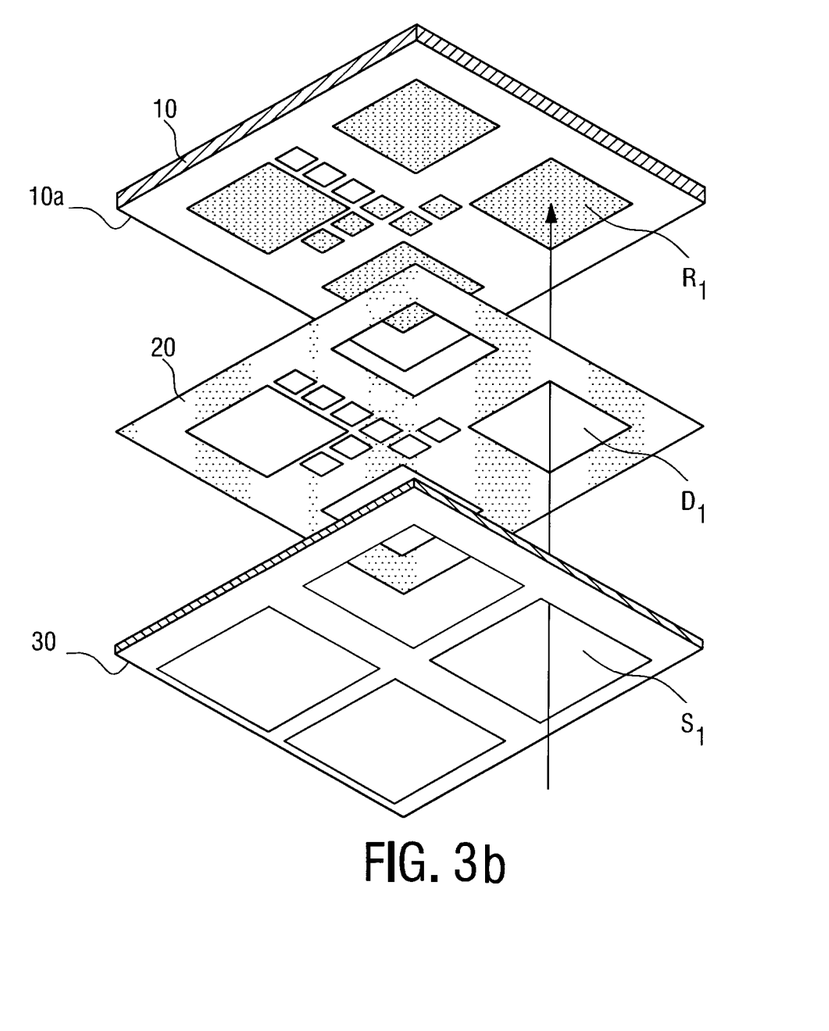
FIG. 3b shows a substrate, a shadow mask and a support structure in an arrangement according to another embodiment of the invention.

FIG. 3b shows another arrangement of a substrate 10, a shadow mask 20, and a support structure 30 including support bars 30a, 30b according to the invention. The shadow mask 20 again is 'sandwiched' between the substrate 10 and the support structure 30. The support structure 30 includes a frame 30c and support bars 30a, 30b extending from the periphery of the support structure, the frame, in the direction of the centre of the support structure. Both support bars 30a and 30b intersect in the centre of the support structure, thereby forming four big openings 31 to 34 together with the frame 30c. As already mentioned with respect to FIG. 3a deposition openings of the shadow mask correspond to regions on the deposition side 10a of the substrate 10, in which material is to be deposited. The big openings of the support structure 30 can correspond to more than one of the deposition openings in the shadow mask. For example, opening 31 in the support structure covers seven smaller deposition openings 21, 22, 23, 24, 25, 26 and 27 in the shadow mask 20. Although the support structure does not have the same shape as the shadow mask 20, it can still provide sufficient support to the shadow mask due to the crossing of support bars 30a and 30b, which effectively supports the central parts of the shadow mask.

Figure 4A:
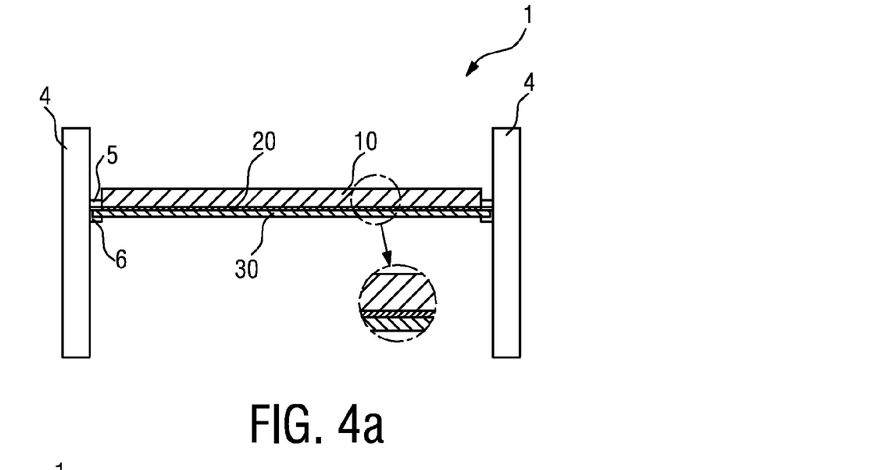
FIG. 4a shows an arrangement for holding a substrate in a material deposition apparatus according to a first embodiment of the invention.

FIG. 4a shows a first embodiment of an arrangement 1 for holding a substrate 10, shadow mask 20, and support mask 30 for transport into a material deposition apparatus. This illustration also includes an enlarged view of a section of the assembly in order to more clearly show that the substrate 10, shadow mask 20 and support mask 30 are in direct contact with one another. Obviously, since the shadow mask 20 is in reality very thin, in the order of tenths of a millimeter, while the substrate 10 can be considerably thicker, these drawings are not to scale.

Since it is essential that the substrate 10, shadow mask 20, and support mask 30 do not move relative to each other during transport or during the material deposition, for reasons known to the skilled person, the substrate 10 is held in the frame—in this example—using appropriate substrate holding means 5, which can be a clamp or other suitable fastening means. Alternatively, depending on the design of the frame 4, the substrate may simply rest on a ledge or rim of the frame 4, or may rest on the support mask so that its weight is borne by the support mask holding means.

Placement of the substrate relative to the support mask may be carried out in an automated process to ensure that the edges of the substrate do not come into contact with any part of the apparatus. The precision of the placement may be controlled by additional cameras or robot devices.

The support mask 30, upon which the shadow mask 20 rests, is secured to the frame 4 using support mask holding means 6. The support mask holding means 6 may actively press the support mask 30 upwards to ensure that the shadow mask 20 is in contact with the deposition side of the substrate 10 over the entire area of the shadow mask 20. This embodiment can be preferred when the support mask 30 is of a non-magnetic material. The substrate holding means 5 can simply comprise a rim or surround positioned in the frame 4 to assist in placement of the substrate 10 during assembly, and need not have any actual supporting function.

Figure 4B:
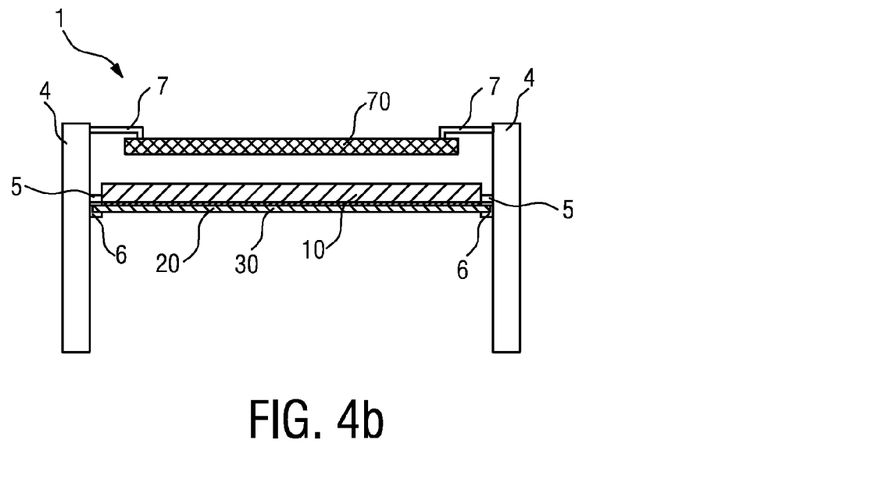
FIG. 4b shows an arrangement for holding a substrate in a material deposition apparatus according to a second embodiment of the invention.

In another embodiment, shown in FIG. 4b, the support mask 30 is at least partially made of a magnetic material. For example, the material of the support mask 30 may include a proportion of neodymium. A magnet 70, held in place on the other, non-deposition side of the substrate 10, acts to pull the support mask 30 towards the deposition side of the substrate 10. The magnet 70 can be a permanent magnet 70, or may be an electromagnet 70 which need only be activated when the support mask 30 is actually to be drawn towards the substrate 10, and may be held in position using suitable holding means 7.

Figure 4C:
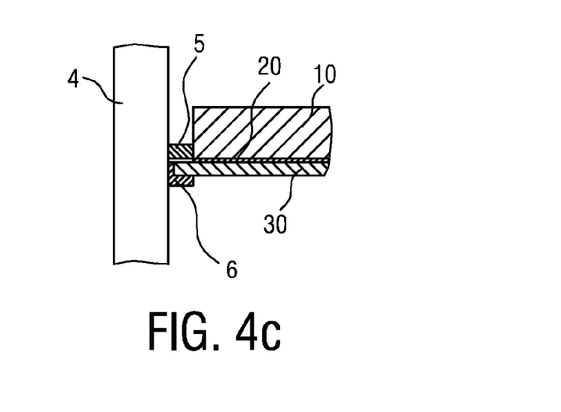
FIG. 4c shows a detailed cross-section of a substrate, shadow mask, and support mask in an arrangement according to the invention.

FIG. 4c shows a close-up view of the substrate holding means 5, upon which the support mask 30 rests. The shadow mask 20 lies on the support mask, and the substrate 10 in turn lies on the shadow mask 20.

Figure 5:
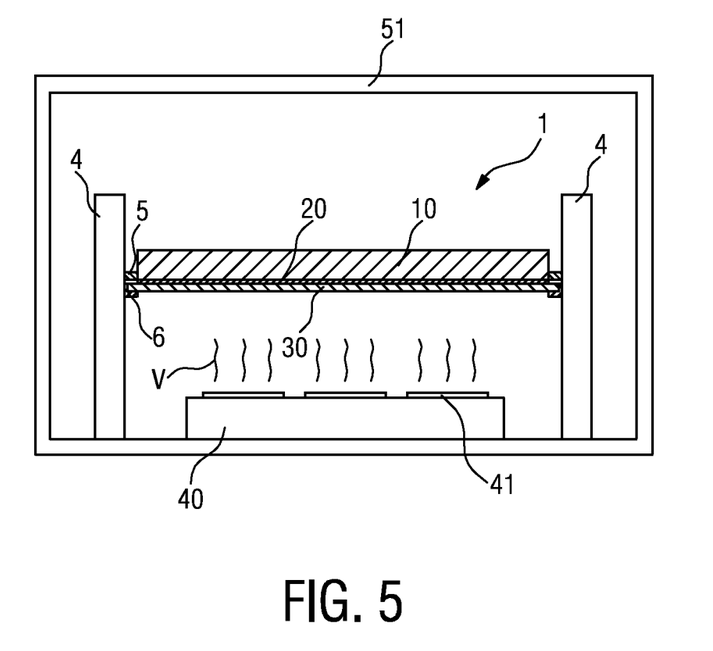
FIG. 5 shows a material deposition apparatus according to a further embodiment of the invention.

FIG. 5 shows a material deposition apparatus, in this case a vapour deposition apparatus, comprising an arrangement 1 such as described above in FIG. 4a. Here, the arrangement comprising the frame 4 holding the substrate 10, shadow mask 20 and support mask 30 is placed into a vacuum chamber 51 such that the substrate is positioned over a heating unit 40. The heating unit 40 heats material in containers 41. The ensuing vapour V rises upwards and passes through surround openings and deposition openings in the support and shadow masks 30, 20 respectively, before being deposited on the underside or deposition side of the substrate 10.

The entire arrangement 1 according to the invention can be automatically placed into a series of such vacuum chambers in a multiple layer deposition procedure, with which the skilled person will be familiar. After one deposition step has been carried out in a first vacuum chamber, the entire arrangement 1 can be removed from that vacuum chamber, for example with a robot arm, and inserted into the next vacuum chamber. In another scenario, the vacuum chambers may be arranged in series, and the arrangement 1 according to the invention may be automatically moved, for example along tracks or rollers, step by step through the chamber sequence.

Although the present invention has been disclosed in the form of preferred embodiments and variations thereon, it will be understood that numerous additional modifications and variations could be made thereto without departing from the scope of the invention. For example, although the above embodiments only mention a single shadow mask or a single support mask, it will be obvious to the skilled person that more than one such mask could be used, for example placed side by side in the holding means.

For the sake of clarity, it is to be understood that the use of "a" or "an" throughout this application does not exclude a plurality, and "comprising" does not exclude other steps or elements. A "unit" or "module" can comprise a number of units or modules, unless otherwise stated.

The invention claimed is:

1. An arrangement for holding a substrate in a material deposition apparatus, which substrate has a deposition side upon which material (M) is to be deposited, and which arrangement comprises
 a shadow mask comprising a number of deposition openings;
 a support structure comprising a number of surround openings; and
 a support structure holder configured to hold the support structure and/or a substrate holder configured to hold the substrate, such that the support structure is on a same side as the deposition side of the substrate, and the shadow mask is positioned between the substrate and the support structure such that at least one deposition opening of the shadow mask lies within a corresponding surround opening of the support structure,
 wherein the substrate, shadow mask, and support structure are in direct contact with one another and the substrate is placed onto an ensemble of the support structure and the shadow mask in a frame so that a weight of the substrate is borne by the support structure holder, the support structure and the shadow mask being separate pieces.

2. The arrangement according to claim 1, wherein a deposition opening of the shadow mask is associated with a surround opening of the support structure.

3. The arrangement according to claim 2, wherein a surround opening of the support structure is larger than the associated deposition opening of the shadow mask.

4. The arrangement according to claim 1, comprising a support structure with a thickness of at least 1.5 mm.

5. The arrangement according to claim 1, comprising a shadow mask with a thickness of at most 0.5 mm.

6. The arrangement according to claim 1, wherein the support structure comprises a magnetic material, and the arrangement comprises a magnet arranged on the side of the substrate opposite to the deposition side to exert a magnetic force on the magnetic support structure.

7. The arrangement according to claim 1, comprising a frame, which frame comprises the substrate holder and/or the support structure holder.

8. The arrangement according to claim 1, wherein the openings of the shadow mask and/or the support structure comprise laser-cut openings and/or photo-chemically etched openings and/or mechanically cut openings.

9. The arrangement according to claim 1, wherein the support structure comprises a support mask or support bars.

10. The arrangement according to claim 1, wherein the support structure comprises a magnetic material and wherein a magnet is positioned on a non-deposition side of the substrate to exert a magnetic force on the support structure.

11. A material deposition apparatus comprising an arrangement for holding a substrate according to claim 1.

12. A method of arranging a substrate comprising a deposition side upon which material is to be deposited;
 a shadow mask comprising a number of deposition openings; and
 a support structure comprising a number of surround openings in a material deposition apparatus, which method comprises
 positioning the shadow mask and the support structure relative to the substrate, such that the support structure is on a same side as the deposition side of the substrate, and the shadow mask is positioned between the substrate and the support structure such that at least one deposition opening of the shadow mask lies within a corresponding surround opening of the support structure, wherein the substrate, shadow mask, and support structure are placed in direct contact with one another and the substrate is placed onto an ensemble of the support structure and the shadow mask in a frame so that a weight of the substrate is borne by a support structure holder, the support structure and the shadow mask being separate pieces.

13. The method according to claim 10, wherein the shadow mask is positioned relative to the support structure such that a deposition opening of the shadow mask is positioned over a corresponding surround opening of the support structure, and such that the deposition opening of the shadow mask lies within the corresponding surround opening of the support structure.

14. A method of performing material deposition on a substrate, wherein the substrate is arranged relative to a shadow mask supported by a support structure using a method according to claim 12.

15. The method according to claim 12, wherein the material deposition is performed in an OLED manufacturing process.

* * * * *